United States Patent
Yamada

(10) Patent No.: US 8,648,624 B2
(45) Date of Patent: Feb. 11, 2014

(54) VOLTAGE-TO-CURRENT CONVERTER CIRCUIT

(75) Inventor: Kouhei Yamada, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/470,004

(22) Filed: May 11, 2012

(65) Prior Publication Data

US 2012/0286827 A1    Nov. 15, 2012

(30) Foreign Application Priority Data

May 13, 2011   (JP) ................. 2011-107745

(51) Int. Cl.
*H02M 11/00*    (2006.01)
(52) U.S. Cl.
USPC ........................................................ 327/103
(58) Field of Classification Search
USPC ........................................................ 327/103
See application file for complete search history.

(56) References Cited

U.S. PATENT DOCUMENTS

| | | | | |
|---|---|---|---|---|
| 5,231,316 A | * | 7/1993 | Thelen, Jr. ................ | 327/103 |
| 5,767,664 A | * | 6/1998 | Price ......................... | 323/313 |
| 5,892,398 A | * | 4/1999 | Candy ....................... | 330/156 |
| 8,183,922 B2 | * | 5/2012 | Fort et al. .................. | 330/261 |
| 2005/0104628 A1 | * | 5/2005 | Tanzawa et al. ............ | 327/63 |
| 2011/0248747 A1 | * | 10/2011 | Huang ....................... | 327/103 |

FOREIGN PATENT DOCUMENTS

JP    62-251816 A    11/1987
JP    2006-174035 A    6/2006

* cited by examiner

*Primary Examiner* — William Hernandez
(74) *Attorney, Agent, or Firm* — Rabin & Berdo, P.C.

(57) ABSTRACT

A voltage-to-current converter circuit has a differential input unit, and is provided with an input offset voltage, wherein the temperature characteristics of the differential input unit and input offset voltage are substantially flat. A current is supplied wherein a second fixed current having positive temperature characteristics is added to a first fixed current having flat characteristics as a bias current to the differential input unit, to balance the temperature characteristics of the differential input unit and the temperature characteristics of the bias current, thus causing the differential input unit transconductance temperature characteristics to be substantially zero (e.g., substantially flat).

14 Claims, 3 Drawing Sheets

VOLTAGE-TO-CURRENT CONVERTER CIRCUIT

CROSS-REFERENCE TO RELATED APPLICATION

This application claims priority under 35 U.S.C. §119 from Japanese Patent Application No. JP PA 2011-107745, filed on May 13, 2011, the entirety of which is incorporated herein by reference.

BACKGROUND OF THE INVENTION

1. Technical Field

The present invention relates to a voltage-to-current converter circuit having transconductance (transfer conductance) with flat temperature characteristics, and in particular, relates to a differential amplifying type of voltage-to-current converter circuit having an output terminal with input offset voltage.

2. Related Art

A differential amplifying type of voltage-to-current converter circuit is often used in a differential amplifier, or a comparator that detects overvoltage, in a power conversion device. FIG. 3 shows an example of a configuration of this kind of heretofore known power conversion device.

FIG. 3 is a pulse width modulation (PWM) type step-down DC/DC converter wherein an output voltage Vo is generated from an input voltage VDD, and supplied to a load Z. The DC/DC converter includes a power source control semiconductor integrated circuit (IC) 1, an inductor L, a capacitor Co, an output terminal Vout, and resistors R10 and R20, which form a voltage setting feedback unit. Also, the power source control IC 1 includes an error amplifier ErrAMP, an oscillator OSC1 that generates a triangular wave Vosc, a PWM comparator PWMC, a P-channel metal oxide semiconductor field effect transistor (MOSFET) MP1 (hereafter, the P-channel MOSFET will be referred to as the P-channel MOS transistor MP1), which is a switching element, an N-channel MOSFET (hereafter referred to as the N-channel MOS transistor) MN1 as a synchronous rectification type commutating element, a drive circuit DRV that drives the P-channel MOS transistor MP1 and N-channel MOS transistor MN1 in accordance with the output of the PWM comparator PWMC, a reference voltage source Vref that generates a reference voltage Vref, a reference voltage source VHi that generates a reference voltage VHi, a comparator CMPHi, an overvoltage protection circuit 2, an input terminal FB, and an output terminal OUT.

The reference voltage Vref is input into the non-inverting input terminal of the error amplifier ErrAMP. An output signal Verr of the error amplifier ErrAMP is input into the non-inverting input terminal of the PWM comparator PWMC, while the triangular wave Vosc is input into the inverting input terminal. The PWM comparator PWMC compares the output signal Verr of the error amplifier ErrAMP and the triangular wave Vosc, and outputs a high (H) level signal when the signal level of the triangular wave Vosc is lower, and a low (L) level signal when the signal level of the triangular wave Vosc is higher, to the drive circuit DRV as a PWM signal. The drains of the P-channel MOS transistor MP1 and N-channel MOS transistor MN1 are connected to each other, and are connected to one end of the inductor L. Also, the sources of the P-channel MOS transistor MP1 and N-channel MOS transistor MN1 are connected to an input power source VDD and a ground potential (GND) respectively. The other end of the inductor L is connected to the output terminal Vout. The capacitor Co and a series circuit of the resistors R10 and R20 are connected in parallel between the output terminal Vout and GND. The potential of a connection point of the resistors R10 and R20 is input as a feedback signal Vfb into the inverting input terminal of the error amplifier ErrAMP via the input terminal FB. Also, the load Z is connected to the output terminal Vout as the load of the DC/DC converter.

Hereafter, a simple description will be given of an action of the DC/DC converter. The error amplifier ErrAMP inputs the signal Verr, wherein the difference between the reference voltage Vref and the feedback signal Vfb is amplified, into the PWM comparator PWMC. The PWM comparator PWMC, by comparing Verr and the triangular wave Vosc, outputs a square wave pulse (PWM signal) which, although of a constant cycle, is such that the ratio between H and L within one cycle changes in accordance with the output of the error amplifier ErrAMP, to the gate of the P-channel MOS transistor MP1 via the drive circuit DRV. That is, an output voltage V0 is kept constant by generating a square wave pulse such that the larger (smaller) (Vref−Vfb) is, the longer (shorter) a period for which the P-channel MOS transistor MP1 is on (conducts) within one cycle, thus increasing (decreasing) the energy accumulated in the inductor L. A square wave pulse is also output in the same way to the gate of the N-channel MOS transistor MN1. The square wave pulses output to the gates of the P-channel MOS transistor MP1 and N-channel MOS transistor MN1 are basically of the same phase but, in order to prevent the P-channel MOS transistor MP1 and N-channel MOS transistor MN1 being on simultaneously and a penetration current flowing, a dead time, which is a period for which both are off, is provided in the drive circuit DRV. When the DC/DC converter is operationally stable, the output voltage V0 becomes Vref×(R10+R20)/R20 owing to the inverting input terminal and non-inverting input terminal of the error amplifier ErrAMP being virtually short-circuited.

The reference voltage source VHi, comparator CMPHi, and overvoltage protection circuit 2 are for stopping the switching action of the DC/DC comparator when the output voltage V0 becomes abnormally high due to trouble occurring in the output line of the DC/DC converter. The value of the reference voltage VHi is higher than the reference voltage Vref, at a value to which the feedback signal Vfb does not rise during normal operation. When the feedback signal Vfb is higher than the reference voltage Vref, the comparator CMPHi inverts the output from low (L) to high (H). The overvoltage protection circuit 2 outputs a signal Stop that stops the switching action immediately on the output of the comparator CMPHi becoming H, or when the output H continues for a predetermined period. The drive circuit DRV, when the signal Stop is input from the overvoltage protection circuit 2, sends an H level signal to the gates of the P-channel MOS transistor MP1 and N-channel MOS transistor MN1, thus turning off the P-channel MOS transistor MP1 and turning on the N-channel MOS transistor MN1, and stopping the switching action, which is the main action of the DC/DC converter, on the safe side.

An example of a specific configuration of a voltage-to-current converter circuit that can be applied to the error amplifier ErrAMP and comparator CMPHi of the DC/DC converter shown in FIG. 3 is shown in JP-A-2006-174035 (FIG. 7, paragraphs [0002] to [0007], and the like). Also, as the voltage-to-current converter circuit needs a comparatively large area in the power source control IC (semiconductor integrated circuit) 1, it is preferable to reduce the number of voltage-to-current converter circuits in order to lower the cost of the control circuit (the power source control IC 1) in the power conversion device. FIG. 4 shows a two output voltage-to-current converter circuit configured based on the voltage-tocurrent converter circuit shown in JP-A-2006-174035 (FIG. 7, paragraphs [0002] to [0007], and the like).

The voltage-to-current converter circuit shown in FIG. 4 has a configuration including, between a high potential side power source potential VDD and a low potential side power source potential GND, a bias current source Ib0, a current mirror circuit formed of P-channel MOS transistors MP01 and MP02, a differential input unit formed of P-channel MOS transistors MP10 and MP11, a current mirror circuit formed of N-channel MOS transistors MN10 and MN11, a current mirror circuit formed of P-channel MOS transistors MP12, MP13, and MP14, and a current mirror circuit formed of N-channel MOS transistors MN12, MN13, and MN14. Also, 1, a, b, c, and d written below the reference numerals and signs affixed to the MOS transistors configuring the current mirror circuits represent the ratio of the input current or output current in the current mirror circuit. In this way, for example, it is shown that the mirror ratio (output current/input current) of the current mirror circuit formed of the N-channel MOS transistors MN10 and MN11 is 1, while the mirror ratio of the current mirror circuit formed of the P-channel MOS transistors MP12 and MP13 is a (=a/1). Also, characteristics of the P-channel MOS transistors MP10 and MP11 configuring the differential input unit are coordinated by arranging that size and manufacturing conditions are the same.

The bias current source Ib0 and current mirror circuit formed of the P-channel MOS transistors MP01 and MP02 are a circuit that supplies a constant bias current to the differential input unit formed of the P-channel MOS transistors MP10 and MP11, and the bias current is distributed to the N-channel MOS transistors MN11 and MN12 in accordance with the difference between two inputs IN+ and IN− input into the differential input unit. Taking the potentials of the inputs IN+ and IN− to be IN+ and IN− too, the sizes and manufacturing conditions of the P-channel MOS transistors MP01 and MP02 are assumed herein to be equivalent, meaning that, when IN+ is greater than IN−, the current flowing through MN11 is greater than the current flowing through MN12, while when IN+ is smaller than IN−, the current flowing through MN11 is smaller than the current flowing through MN12. The current flowing through the N-channel MOS transistor MN11 is set so as to be copied and fed back by the current mirror circuit formed of the N-channel MOS transistors MN10 and MN11 and the current mirror circuit formed of the P-channel MOS transistors MP12, MP13, and MP14, and discharged from the drains of the P-channel MOS transistors MP13 and MP14 further increased by a times and b times respectively. That is, the current mirror circuit formed of the P-channel MOS transistors MP12, MP13, and MP14 is a current source type current mirror circuit. Also, the current flowing through the N-channel MOS transistor MN12 is set so as to be copied and fed back by the current mirror circuit formed of the N-channel MOS transistors MN12, MN13, and MN14, and suctioned from the drains of the N-channel MOS transistors MN13 and MN14 further increased by c times and d times respectively. That is, the current mirror circuit formed of the N-channel MOS transistors MN12, MN13, and MN14 is a current sink type current mirror circuit.

The drain of the P-channel MOS transistor MP13 and the drain of the N-channel MOS transistor MN13 are connected to a first output terminal Out1 of the voltage-to-current converter circuit, while the drain of the P-channel MOS transistor MP14 and the drain of the N-channel MOS transistor MN14 are connected to a second output terminal Out2 of the voltage-to-current converter circuit. A current equivalent to the difference between the drain current of the P-channel MOS transistor MP13 and the drain current of the N-channel MOS transistor MN13 is output from the output terminal Out1, while a current equivalent to the difference between the drain current of the P-channel MOS transistor MP14 and the drain current of the N-channel MOS transistor MN14 is output from the output terminal Out2. Provided that nothing other than the gates of the MOS transistors is connected to the output terminals Out1 and Out2, the voltage of the output terminals Out1 and Out2 is directed to either the high potential side power source potential VDD or the low potential side power source potential GND, with a point at which the output current reaches zero as a dividing line, meaning that the voltage-to-current converter circuit can be utilized as a comparator or an operational amplifier.

Herein, assuming that a=c, the input offset voltage relating to the output from the output terminal Out1 is zero (the output current from the output terminal Out1 is zero when IN+=IN−). Meanwhile, with regard to the output terminal Out2, assuming that b≠d, the input offset voltage relating to the output of the output terminal Out2 does not become zero. That is, the output of the output terminal Out2 has a positive input offset voltage when b is greater than d (assuming the absolute value of the offset voltage to be ofsv (>0), the output current from the output terminal Out1 is zero when (IN−)=(IN+)+ofsv), and has a negative input offset voltage when b is smaller than d (the output current from the output terminal Out1 is zero when (IN−)=(IN+)−ofsv). Utilizing this, assuming that b is greater than d, it is possible to combine the two voltage-to-current converter circuits shown in FIG. 3 in one by inputting the feedback signal Vfb of FIG. 3 into IN+ and inputting the reference voltage Vref into IN−, and thus possible to lower the cost of the control circuit. In this case, the reference voltage VHi of FIG. 3 is obtained by VHi=Vref+ofsv.

Considering the temperature characteristics of the voltage-to-current converter circuit of FIG. 4, firstly, the transconductance of the differential input unit (=(the difference between the drain currents of the two transistors configuring the differential input unit)/(the difference between the two input voltages)) are determined by the transconductance of the P-channel MOS transistors MP10 and MP11 configuring the differential input unit, wherein the transconductance of the MOS transistors depends on the bias current and the size of the MOS transistors, and has negative temperature characteristics. With regard to whether the temperature characteristics are positive or negative, they are taken to be positive when the absolute value of a characteristic value indicating the temperature characteristics rises along with the temperature, and negative when the absolute value of the characteristic value decreases on the temperature rising. Consequently, the transconductance of the differential input unit also has negative temperature characteristics. Also, when providing an input offset voltage by adjusting the mirror ratio of the current mirror circuits, as with the output terminal Out2, the input offset voltage also has temperature characteristics. When a voltage-to-current converter circuit wherein the differential input unit transconductance and input offset voltage have temperature characteristics is applied to the kind of DC/DC converter shown in FIG. 3, the stability of a feedback loop and an overvoltage protection threshold value voltage in the DC/DC converter are temperature-dependent, which is not desirable in terms of the stability of the DC/DC converter.

With regard to the case of the output terminal Out2, as a similar circuit, there is known a method whereby the temperature characteristics of a fixed current circuit that outputs a fixed current by combining a source type current mirror circuit and a sink type current mirror circuit are caused to be zero (for example, refer to JP-A-62-251816), but no method has been known whereby the output current value is variable, and the temperature characteristics are zero along with those of the differential input unit.

SUMMARY OF THE INVENTION

An object of the invention is to provide a voltage-to-current converter circuit that has a differential input unit, and is provided with an input offset voltage by adjusting the mirror ratios of current mirror circuits, wherein there are no differential input unit transconductance temperature characteristics (the temperature characteristics are substantially zero, or are substantially flat). Furthermore, an object of the invention is to provide a voltage-to-current converter circuit with which it is also possible to realize an input offset voltage with no temperature characteristics.

Therefore, in order to solve the heretofore described problems, according to a first aspect of the invention, there is provided a voltage-to-current converter circuit, wherein a current, in which a second fixed current having positive temperature characteristics is added to a first fixed current having flat characteristics, is supplied as a bias current to a differential input unit of which transconductance has negative temperature characteristics.

According to a second aspect of the invention, there is provided the voltage-to-current converter circuit according to the first aspect of the invention, wherein the differential input unit includes two input terminals, a first output terminal, and a second output terminal, the voltage-to-current converter circuit including a current source type first current mirror circuit that has current output from the first output terminal as an input, and a current sink type second current mirror circuit that has current output from the second output terminal as an input, wherein the first and second current mirror circuits each include first and second output terminals, a connection point of a first output terminal of the first current mirror circuit and a first output terminal of the second current mirror circuit forms a first output terminal of the voltage-to-current converter circuit, and a connection point of a second output terminal of the first current mirror circuit and a second output terminal of the second current mirror circuit forms a second output terminal of the voltage-to-current converter circuit, and an output of a third current mirror circuit that outputs a current proportional to the first fixed current is connected to the second connection point.

According to a third aspect of the invention, there is provided the voltage-to-current converter circuit according to the second aspect of the invention, wherein when the mirror ratios of the first and second output terminals with respect to an input terminal in the first current mirror circuit are a and b respectively, and the mirror ratios of the first and second output terminals with respect to an input terminal in the second current mirror circuit are c and d respectively, it is assumed that a=c and b=d.

According to a fourth aspect of the invention, there is provided the voltage-to-current converter circuit according to the first aspect of the invention, wherein the differential input unit, first current mirror circuit, second current mirror circuit, and third current mirror circuit are configured of MOSFETs.

With the voltage-to-current converter circuit of the invention, it is possible, by supplying a current wherein a second fixed current having positive temperature characteristics is added to a first fixed current having flat characteristics as a bias current to the differential input unit, to balance the temperature characteristics of the differential input unit and the temperature characteristics of the bias current, thus causing the differential input unit transconductance temperature characteristics to be substantially zero (e.g., substantially flat). Also, by using connection points of the outputs of the current source type first current mirror circuit and the outputs of the current sink type second current mirror circuit as the output terminals of the voltage-to-current converter circuit, and applying a current proportional to the first fixed current to the connection points, it is also possible to realize an input offset voltage with no temperature characteristics.

DETAILED DESCRIPTION OF THE EMBODIMENTS

Figure 1:
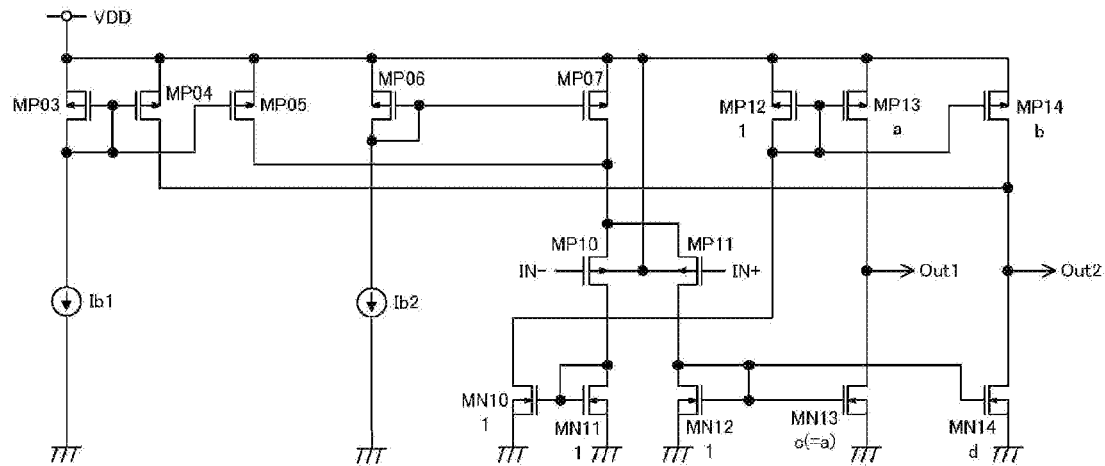
FIG. 1 is a diagram showing an example of a configuration of a voltage-to-current converter circuit according to the invention.

Hereafter, a detailed description will be given, referring to the drawings, of an embodiment of the invention.

Figure 4:
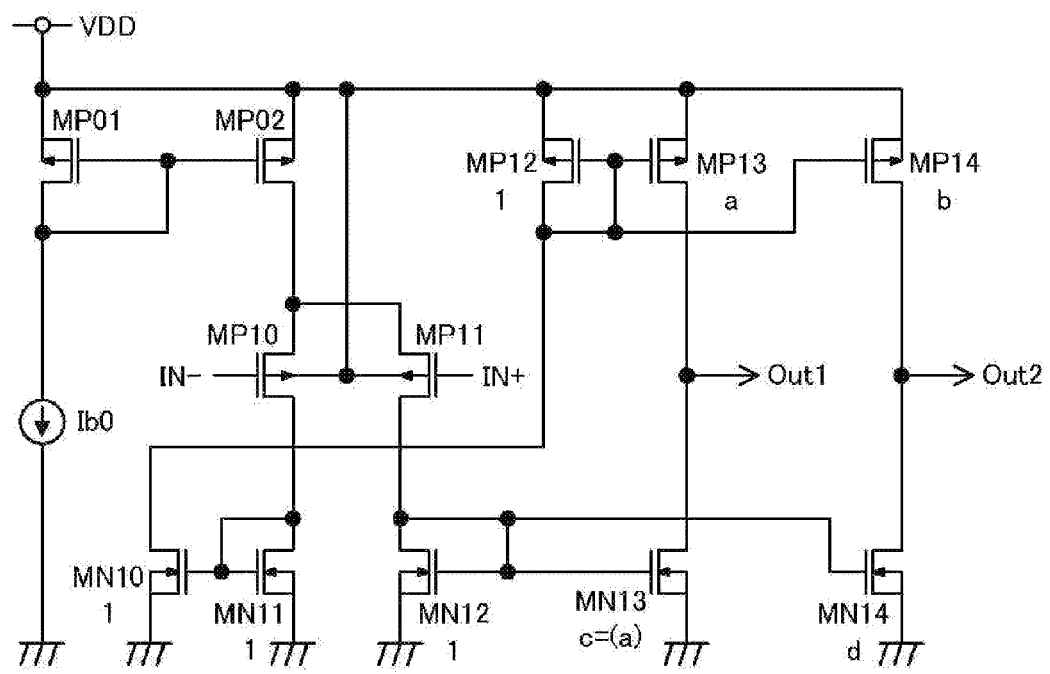
FIG. 4 is a diagram for illustrating a configuration of a heretofore known voltage-to-current converter circuit.

FIG. 1 shows an example of a configuration of a voltage-to-current converter circuit according to the invention. The same reference numerals and signs are given to regions the same as in FIG. 4, and a detailed description thereof is omitted. Two bias current sources, Ib1 and Ib2, are prepared for the voltage-to-current converter circuit shown in FIG. 1. Ib1 is a bias current source having flat temperature characteristics, while Ib2 is a bias current source having positive temperature characteristics. Herein, "flat" with relation to the bias current source Ib1 does not only refer to temperature characteristics that are absolutely zero, but also includes temperature characteristics of an extent that can be ignored within a temperature range in which a change in the voltage-to-current converter circuit is used. Also, an example of a configuration of a bias current source circuit will be described hereafter.

A current Ib1 from the bias current source Ib1 is copied by a current mirror circuit formed of P-channel MOS transistors MP03, MP04, and MP05, and supplied to a differential input unit and an output terminal Out2. Also, a current Ib2 from the bias current source Ib2 is copied by a current mirror circuit formed of P-channel MOS transistors MP06 and MP07, and supplied to the differential input unit. By supplying a bias current that has positive temperature characteristics to a differential input unit that has negative temperature characteristics, it is possible to cause the transconductance temperature characteristics of the differential input unit to be flat temperature characteristics. This can be realized by appropriately adjusting the size of P-channel MOS transistors MP10 and MP11 configuring the differential input unit, the mirror ratio of the current mirror circuit of MP06 and MP07, and the mirror ratio of the current mirror circuit of MP03 and MP05.

Specifically, after selecting a bias current value of around room temperature, and the size of the P-channel MOS transistors MP10 and MP11 configuring the differential input unit, it is possible, when the transconductance has negative temperature characteristics, to realize a desired transconductance by adjusting so that the transconductance temperature coefficient is zero by reducing the ratio of the MP05 with respect to the MP03 and increasing the ratio of the MP07 with respect to the MP06. When the transconductance has positive temperature characteristics, it is sufficient to carry out a reverse adjustment. To give an example in a certain manufacturing process, when MP10 and MP11 are such that W/L=48 μm/3 μm, Ib1 is 2 μA (temperature coefficient zero), and Ib2 is 2 μA (value at 25° C.: the current value of Ib2 is proportional to the absolute temperature), the ratio of MP03 to MP05 is 2 to 1, and the ratio of MP06 to MP07 is 2 to 5.

A current output from the drain of the P-channel MOS transistor MP10, which is a first output terminal of a differential input stage, after being copied by a current mirror circuit formed of N-channel MOS transistors MN10 and MN11, is further copied by a first current mirror circuit formed of P-channel MOS transistors MP12, MP13, and MP14, and supplied to a first output terminal Out1 and the second output terminal Out2. Herein, the first current mirror circuit is a current source type current mirror circuit that discharges a current proportional to the current output from the first output terminal of the differential input stage.

A current output from the drain of the P-channel MOS transistor MP11, which is a second output terminal of the differential input stage, is copied by a second current mirror circuit formed of N-channel MOS transistors MN12, MN13, and MN14, and supplied to the first output terminal Out1 and second output terminal Out2. Herein, the second current mirror circuit is a current sink type current mirror circuit that suctions a current proportional to the current output from the second output terminal of the differential input stage.

In the embodiment, it is assumed that a=c and b=d. By so doing, an input offset voltage relating to the output terminal Out1 is zero. As things stand, an input offset voltage relating to the output terminal Out2 is also zero, but by further applying a current proportional to the current Ib1 to the output terminal Out2 using a third current mirror circuit formed of the P-channel MOS transistors MP03 and MP04, it is possible to realize a positive input offset voltage. As the configuration is such that the transconductance temperature characteristics of the differential input unit are flat, and an input offset voltage is generated based on a current proportional to the current Ib1, whose temperature characteristics are (practically) flat, as heretofore described, it is also possible to cause the input offset voltage to be (practically) flat.

Also, by configuring in such a way that a current from the P-channel MOS transistor MP04 is further copied by a current mirror circuit formed of N-channel MOS transistors, and a current proportional to the current Ib1 is suctioned from the output terminal Out2, it is possible to realize a negative input offset voltage.

Figure 2:
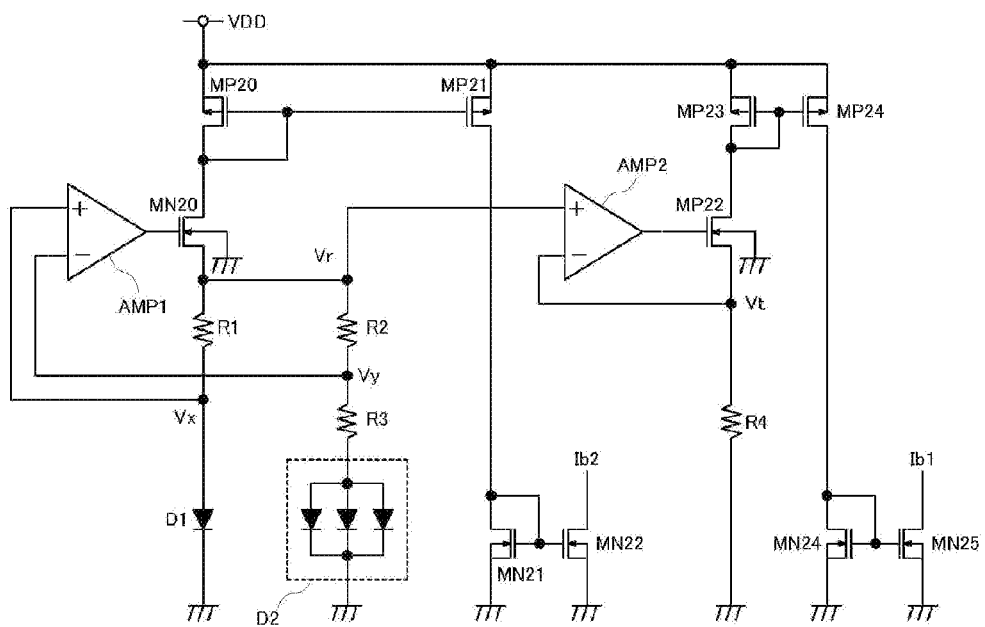
FIG. 2 is a diagram showing an example of a configuration of a current source circuit used in the voltage-to-current converter circuit of FIG. 1.
Figure 3:
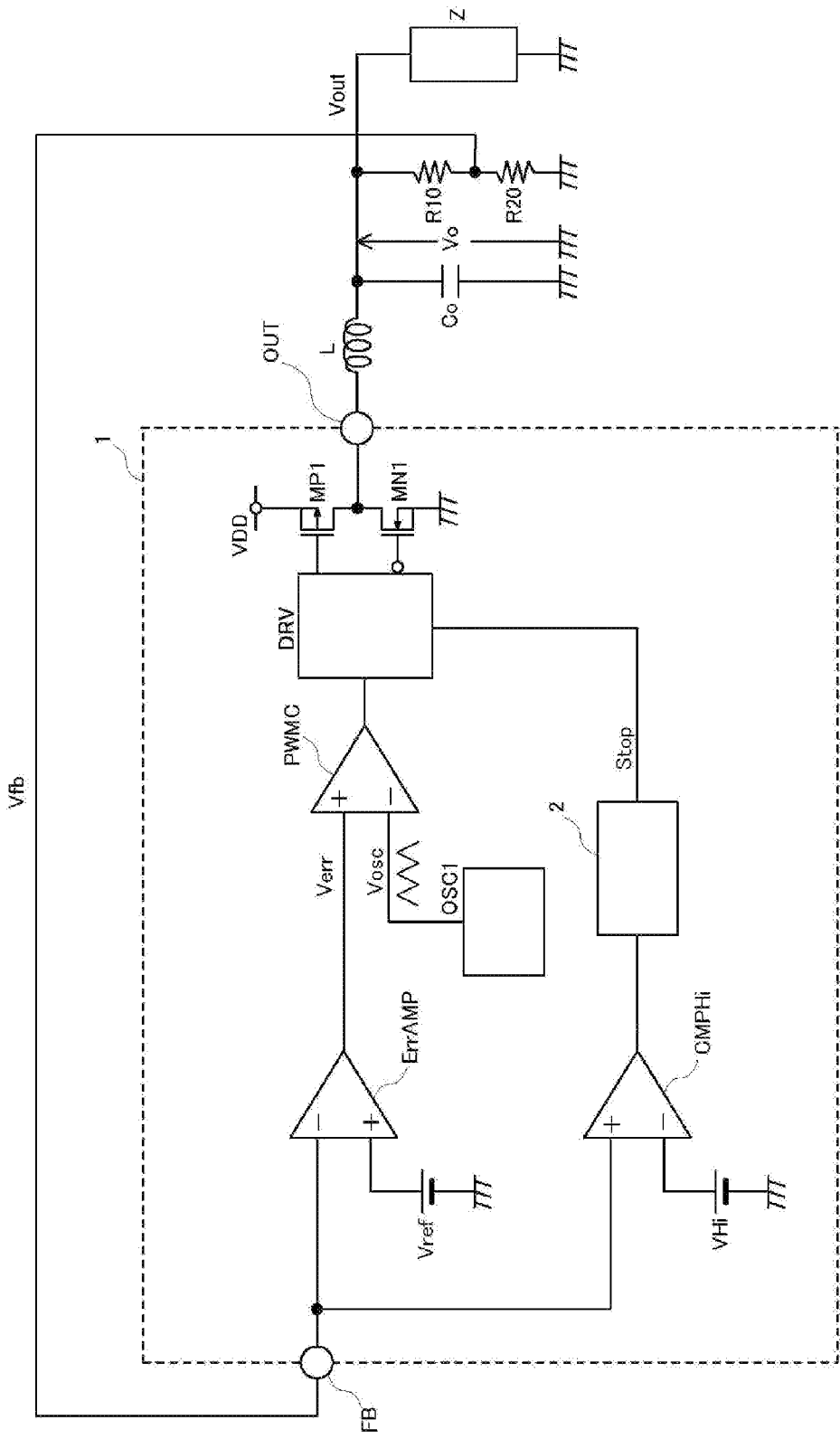
FIG. 3 is a diagram showing an example of a configuration of a step-down DC/DC converter.

FIG. 2 shows an example of a configuration of a current source circuit that generates the current Ib1 having (practically) flat temperature characteristics and the current Ib2 having positive temperature characteristics. The current source circuit shown in FIG. 2 utilizes a bandgap circuit, and includes P-channel MOS transistors MP20 to MP24, N-channel MOS transistors MN20 to MN25, operational amplifiers AMP1 and AMP2, resistors R1 to R4, and diodes D1 and D2. In order to simplify the description, it is assumed that resistors with flat temperature characteristics are applied as the resistors R1 to R4. The diode D2 has a configuration wherein plural diodes of the same size as the diode D1 are connected in parallel, and when the same current is caused to flow through the diodes D1 and D2, the voltage applied to the diode D2 is lower than the voltage applied to the diode D1. The resistors R1 and R2 are connected at one end, each end having the same potential (Vr). Also, the other ends of the resistors R1 and R2 also have the same potential (Vx=Vy) owing to being virtually short-circuited by the operational amplifier AMP1. Consequently, an equivalent voltage is applied to the resistors R1 and R2, and by causing a resistance value R1 of the resistor R1 and a resistance value R2 of the resistor R2 to be equivalent, an equivalent current flows through the two resistors R1 and R2. However, as the voltage applied differs between the diodes D1 and D2, as heretofore described, the voltage difference is applied to the resistor R3 (a resistance value is also taken to be R3). As the voltage difference is roughly proportional to the absolute temperature, a current proportional to the absolute temperature flows through the resistors R1, R2, and R3. The current flowing through the resistor R1 is copied by a current mirror circuit formed of the P-channel MOS transistors MP20 and MP21 and a current mirror circuit formed of the N-channel MOS transistors MN21 and MN22, and supplied from the N-channel MOS transistor MN22 as the current Ib2 having positive temperature characteristics.

Meanwhile, as the absolute value of the voltage applied to the diodes D1 and D2 has negative temperature characteristics, it is possible, by setting an appropriate ratio between the resistance values R3 and R2 (=R1), to flatten the temperature characteristics of the potential Vr. A potential Vt, being virtually short-circuited by the operational amplifier AMP2, is equivalent to the potential Vr and, as the potential Vt is applied to the resistor R4, a current having flat temperature characteristics flows through the resistor R4. This current is copied by a current mirror circuit formed of the P-channel MOS transistors MP23 and MP24, and by the N-channel MOS transistors MN24 and MN25, and supplied from the N-channel MOS transistor MN25 as the current Ib1 having flat temperature characteristics.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

What is claimed is:

1. A voltage-to-current converter circuit, wherein
a current, in which a second fixed current having positive temperature characteristics is added to a first fixed current having flat temperature characteristics, is supplied as a bias current to a differential input unit of which transconductance has negative temperature characteristics.

2. The voltage-to-current converter circuit according to claim 1, wherein
the differential input unit includes two input terminals, a first output terminal, and a second output terminal,
the voltage-to-current converter circuit comprising:
a current source type first current mirror circuit that has current output from the first output terminal of the differential input unit as an input; and
a current sink type second current mirror circuit that has current output from the second output terminal of the differential input unit as an input, wherein
the first and second current mirror circuits each include first and second output terminals, a connection point of the first output terminal of the first current mirror circuit and the first output terminal of the second current mirror circuit forms a first output terminal of the voltage-tocurrent converter circuit, and a connection point of the second output terminal of the first current mirror circuit and the second output terminal of the second current mirror circuit forms a second output terminal of the voltage-to-current converter circuit, and an output of a third current mirror circuit that outputs a current proportional to the first fixed current is connected to the connection point.

3. The voltage-to-current converter circuit according to claim 2, wherein when mirror ratios of the first and second output terminals of the first current mirror circuit with respect to an input terminal in the first current mirror circuit are a and b respectively, and mirror ratios of the first and second output terminals of the second current mirror circuit with respect to an input terminal in the second current mirror circuit are c and d respectively, it is assumed that a=c and b=d.

4. The voltage-to-current converter circuit according to claim 2, wherein the differential input unit, the first current mirror circuit, the second current mirror circuit, and the third current mirror circuit are configured with MOSFETs.

5. A circuit, comprising:

a first current source configured to generate a first current having first predetermined temperature characteristics;

a second current source configured to generate a second current having second predetermined temperature characteristics; and a differential input component having the first current and the second current supplied as a bias current, and having third predetermined temperature characteristics;

wherein the bias current is configured to cause a transconductance of the differential input component to have fourth predetermined temperature characteristics.

6. The circuit of claim 5, wherein the first predetermined temperature characteristics include a substantially flat temperature characteristic, the second predetermined temperature characteristics include a positive temperature characteristic, the third predetermined temperature characteristics include a negative temperature characteristic, and the fourth predetermined temperature characteristics include a substantially flat temperature characteristic.

7. The circuit of claim 5, further comprising a first current mirror circuit coupled to a first output of the differential input component.

8. The circuit of claim 7, further comprising a second current mirror circuit coupled to a second output of the differential input component.

9. The circuit of claim 7, wherein the first current mirror circuit is further coupled to a current mirror circuit configured to output a current proportional to the first current.

10. The circuit of claim 8, wherein the first current mirror circuit is a current source;

the second current mirror circuit is a current sink; and the first current mirror circuit is coupled to the second current mirror circuit.

11. The circuit of claim 10, wherein a mirror ratio associated with the first current mirror circuit is substantially equal to a mirror ratio associated with the second current mirror circuit.

12. The circuit of claim 5, further comprising a biasing current mirror circuit associated with the first current source, and coupled to the differential input component, wherein the biasing current mirror circuit associated with the first current source has a mirror ratio configured to cause the transconductance of the differential input component to have the fourth predetermined temperature characteristics.

13. The circuit of claim 12, wherein the differential input component includes switching elements with relative sizes configured to, in combination with the mirror ratio of the biasing current mirror circuit associated with the first current source, cause the transconductance of the differential input component to have the fourth predetermined temperature characteristics.

14. The circuit of claim 13, further comprising a biasing current mirror circuit associated with the second current source, and having a mirror ratio configured to, in combination with the mirror ratio of the biasing current mirror circuit associated with the first current source and the switching elements of the differential input component, cause the transconductance of the differential input component to have the fourth predetermined temperature characteristics.

\* \* \* \* \*